United States Patent
Rexha et al.

(10) Patent No.: US 10,211,736 B2
(45) Date of Patent: Feb. 19, 2019

(54) POWER SUPPLY SYSTEM AND DETECTION SYSTEM FOR DETERMINING AN UNBALANCED CURRENT CONDITION AND AN OVERCURRENT CONDITION IN A DC-DC VOLTAGE CONVERTER

(71) Applicant: LG Chem, Ltd., Seoul (KR)

(72) Inventors: Mehdi Rexha, Sterling Heights, MI (US); Jaesam Lee, Ansan-si (KR); Chieh-Kai Chang, Madison Heights, MI (US)

(73) Assignee: LG Chem, Ltd., Seoul (KR)

( * ) Notice: Subject to any disclaimer, the term of this patent is extended or adjusted under 35 U.S.C. 154(b) by 174 days.

(21) Appl. No.: 15/413,185

(22) Filed: Jan. 23, 2017

(65) Prior Publication Data
US 2018/0212522 A1 Jul. 26, 2018

(51) Int. Cl.
*G01R 19/00* (2006.01)
*H02M 3/158* (2006.01)
*G01R 31/40* (2014.01)
*G01R 19/165* (2006.01)
*H02M 1/32* (2007.01)

(52) U.S. Cl.
CPC ........ *H02M 3/1584* (2013.01); *G01R 19/165* (2013.01); *G01R 31/40* (2013.01); *H02M 1/32* (2013.01); *H02M 2003/1586* (2013.01)

(58) Field of Classification Search
CPC .............................. H02M 3/02; G01R 19/165
USPC .................................................. 307/112, 151
See application file for complete search history.

(56) References Cited

U.S. PATENT DOCUMENTS

| | | | | |
|---|---|---|---|---|
| 6,246,220 B1 * | 6/2001 | Isham | .................. | H02M 3/1588 323/224 |
| 6,424,129 B1 * | 7/2002 | Lethellier | ........... | H02M 3/1584 323/272 |
| 6,670,794 B1 * | 12/2003 | Wang | .................. | H02M 3/1584 323/213 |
| 6,801,030 B2 * | 10/2004 | Tai | ..................... | G01R 19/0092 323/316 |
| 6,812,677 B2 * | 11/2004 | Walters | ................. | H02M 3/156 323/275 |

(Continued)

FOREIGN PATENT DOCUMENTS

| | | |
|---|---|---|
| JP | 2533774 Y | 1/1997 |
| JP | 2007068381 A | 3/2007 |
| JP | 2014143782 A | 8/2014 |

*Primary Examiner* — Adi Amrany
(74) *Attorney, Agent, or Firm* — Buckert Patent & Trademark Law Firm PC; John F. Buckert

(57) ABSTRACT

A power supply system having a detection system for determining an unbalanced current condition and an over-current condition in a DC-DC voltage converter is provided. The detection system has a detection circuit that outputs a first diagnostic voltage indicating an unbalanced current condition between first and second switching banks in the DC-DC voltage converter based on a first voltage and an average voltage, or an over-current condition in the first switching bank based on the first voltage. The detection circuit outputs a second diagnostic voltage indicating the unbalanced current condition between the first and second switching banks in the DC-DC voltage converter based on a second voltage and the average voltage, or an over-current condition in the second switching bank based on the second voltage.

18 Claims, 4 Drawing Sheets

(56) References Cited

U.S. PATENT DOCUMENTS

| | | | |
|---|---|---|---|
| 6,891,736 B2 | 5/2005 | Takemura et al. | |
| 7,045,993 B1 * | 5/2006 | Tomiyoshi | H02M 3/1588 |
| | | | 323/224 |
| 7,046,533 B2 | 5/2006 | Takemura et al. | |
| 7,113,379 B2 | 9/2006 | Matsumoto | |
| 7,339,804 B2 | 3/2008 | Uchida | |
| 7,714,555 B2 * | 5/2010 | Lee | H02M 3/156 |
| | | | 323/282 |
| 7,759,918 B2 * | 7/2010 | Moyer | H02M 3/1584 |
| | | | 323/272 |
| 7,940,030 B2 * | 5/2011 | Cannella | H02M 1/32 |
| | | | 323/222 |
| 8,917,077 B2 * | 12/2014 | Lin | G05F 1/10 |
| | | | 323/271 |
| 2005/0258808 A1 * | 11/2005 | Chen | H02H 7/1213 |
| | | | 323/222 |
| 2006/0091872 A1 * | 5/2006 | Matsuura | H02M 3/156 |
| | | | 323/283 |
| 2010/0314945 A1 * | 12/2010 | Yamazaki | H02M 3/157 |
| | | | 307/80 |
| 2012/0074949 A1 | 3/2012 | Kepley et al. | |
| 2016/0064986 A1 * | 3/2016 | Langlinais | G06F 1/263 |
| | | | 320/134 |

\* cited by examiner

POWER SUPPLY SYSTEM AND DETECTION SYSTEM FOR DETERMINING AN UNBALANCED CURRENT CONDITION AND AN OVERCURRENT CONDITION IN A DC-DC VOLTAGE CONVERTER

BACKGROUND

Power supply systems have utilized DC-DC voltage converters to generate a DC voltage. The power supply systems, however, have not been able to determine an unbalanced current condition in first and second switching banks within the DC-DC voltage converter if an over-current condition in one of the first and second switching banks is not detectable.

The inventors herein have utilized a power supply system with a DC-DC voltage converter having multiphase switching banks where an interleaved current is followed by dividing an entire switching period on a number of interleaved arms in each switching bank. In an exemplary embodiment, the multiphase system utilizes first and second switching banks each having three arms, and each of the first and second switching banks has one current sensing resistor. The power supply system further includes a detection system that can determine an unbalanced current condition in first and second switching banks, at either one of the first and second switching banks, within a DC-DC voltage converter even if an over-current condition in one of the first and second switching banks is not detectable.

SUMMARY

A detection system for determining an unbalanced current condition and an over-current condition in a DC-DC voltage converter in accordance with an exemplary embodiment is provided. The DC-DC voltage converter has first and second switching banks. The first switching bank has first and second switches that are selectively electrically coupled in series with a first resistor. The second switching bank has third and fourth switches that are selectively electrically coupled in series to a second resistor. The detection system includes a detection circuit receiving a first voltage across the first resistor. The first resistor is electrically coupled to the first switching bank. The detection circuit receives a second voltage across the second resistor. The second resistor is electrically coupled to the second switching bank. The detection circuit determines an average voltage based on the first and second voltages. The detection circuit outputs a first diagnostic voltage indicating either an unbalanced current condition between the first and second switching banks in the DC-DC voltage converter based on the first voltage and the average voltage, or an over-current condition in the first switching bank based on the first voltage. The detection circuit outputs a second diagnostic voltage indicating either the unbalanced current condition between the first and second switching banks in the DC-DC voltage converter based on the second voltage and the average voltage, or an over-current condition in the second switching bank based on the second voltage.

A power supply system in accordance with another exemplary embodiment is provided. The power supply system includes a DC-DC voltage converter having first and second switching banks, first and second resistors, first and second electrical coils, first and second power switches, and first and second batteries. The first switching bank has first and second switches that are selectively electrically coupled in series to the first resistor. The second switching bank has third and fourth switches that are selectively electrically coupled in series to the second resistor. The first electrical coil has first and second ends. The first end of the first electrical coil is electrically coupled to a first electrical node disposed between the first and second switches. The second end of the first electrical coil is electrically coupled to a second electrical node. The second electrical coil has first and second ends. The first end of the second electrical coil is electrically coupled to a third electrical node disposed between the third and fourth switches. The second end of the second electrical coil is electrically coupled to the second electrical node. The power supply system further includes a first power switch having first and second terminals. The first terminal of the first power switch is electrically coupled to the first battery. The second terminal of the first power switch is electrically coupled to both the first switch of the first switching bank and to the third switch of the second switching bank. The power supply system further includes a second power switch having first and second terminals. The first terminal of the second power switch is electrically coupled to the second electrical node. The second terminal of the second power switch is electrically coupled to the second battery. The power supply system further includes a detection circuit receiving a first voltage across the first resistor. The first resistor is electrically coupled to the first switching bank. The detection circuit receives a second voltage across the second resistor. The second resistor is electrically coupled to the second switching bank. The detection circuit determines an average voltage based on the first and second voltages. The detection circuit outputs a first diagnostic voltage indicating either an unbalanced current condition between the first and second switching banks in the DC-DC voltage converter based on the first voltage and the average voltage, or an over-current condition in the first switching bank based on the first voltage. The detection circuit outputs a second diagnostic voltage indicating either the unbalanced current condition between the first and second switching banks in the DC-DC voltage converter based on the second voltage and the average voltage, or an over-current condition in the second switching bank based on the second voltage.

DETAILED DESCRIPTION

Figure 1:
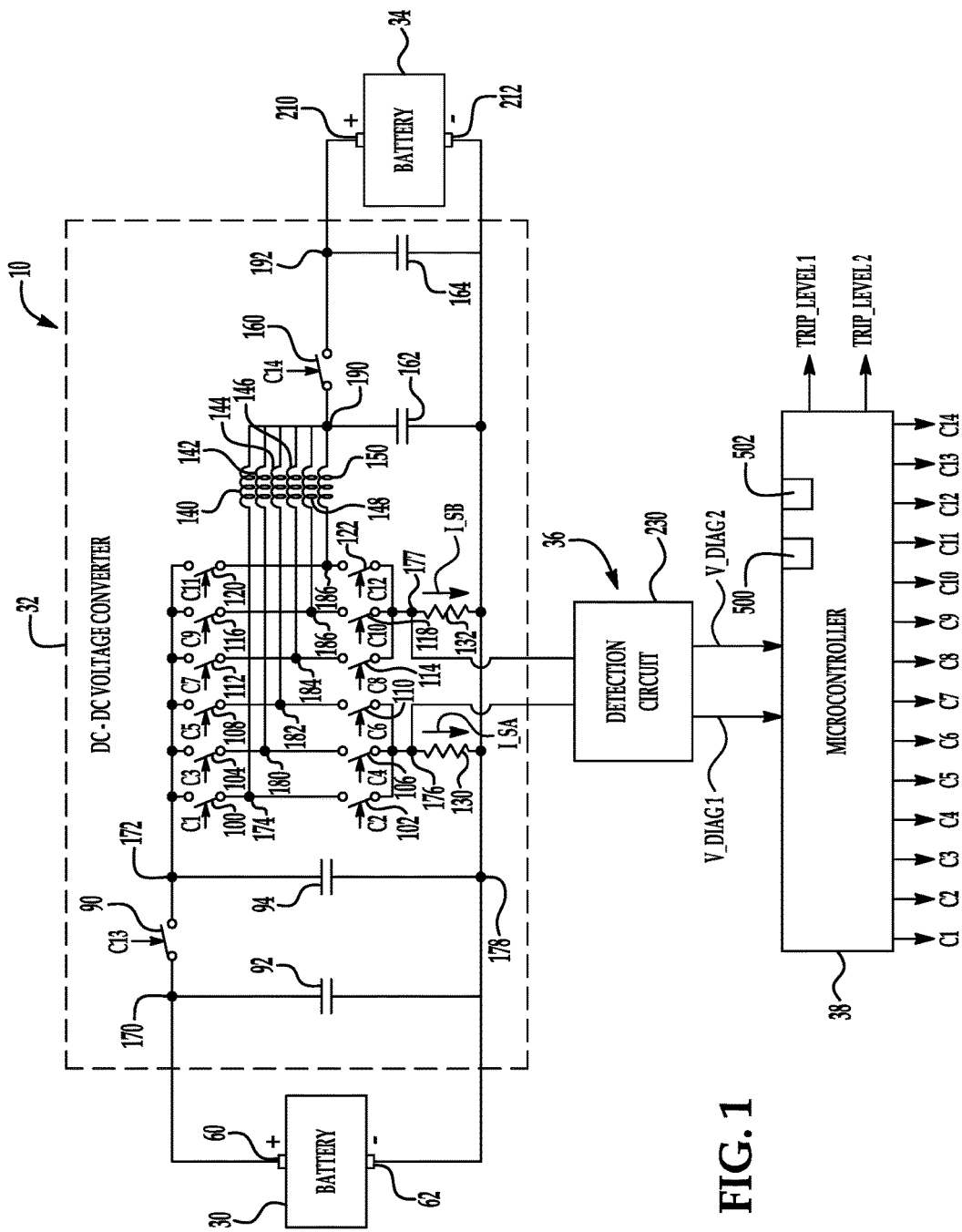
FIG. 1 is a schematic of a power supply system in accordance with an exemplary embodiment.

Referring to FIG. 1, a power supply system 10 in accordance with an exemplary embodiment is provided. The power supply system 10 includes a battery 30, a DC-DC voltage converter 32, a battery 34, a detection system 36, and a microcontroller 38. An advantage of the power supply system 10 is that the system 10 utilizes the detection system 36 to determine an unbalanced current condition in first and second switching banks within the DC-DC voltage converter 32 utilizing an average voltage value—even if an overcurrent condition in one of first and second switching banks in the DC-DC voltage converter 32 is not detectable.

For definitional purposes, when a second signal is based on a first signal, the second signal can be generated directly from the first signal, or the second signal can be generated indirectly from the first signal utilizing intermediate signals.

The battery 30 provides a first operational voltage to the DC-DC voltage converter 32. The battery 30 includes a positive terminal 60 and a negative terminal 62. The positive terminal 60 is electrically coupled to the electrical node 170 and to a first terminal of the power switch 90. The negative terminal 62 is electrically coupled to the electrical node 178 and to the negative terminal 212 of the battery 34. In an exemplary embodiment, the battery 60 is a high-voltage lithium-ion battery.

The DC-DC voltage converter 32 is provided to convert a first operational voltage from the battery 30 to a second operational voltage that is applied to the battery 34 during a buck operational mode. Further, the DC-DC voltage converter 32 is provided to convert the second operational voltage from the battery 34 to the first operational voltage that is applied to the battery 30 during a boost operational mode. The DC-DC voltage converter 32 includes a power switch 90, capacitors 92, 94, switches 100, 102, 104, 106, 108, 110, 112, 114, 116, 118, 120, 122, resistors 130, 132, electrical coils 140, 142, 144, 146, 148, 150, a power switch 160, capacitors 162, 164, and electrical nodes 170, 172, 174, 176, 177, 178, 180, 182, 184, 186, 188, 190, 192. In an exemplary embodiment, each of the switches 100, 102, 104, 106, 108, 110, 112, 114, 116, 118, 120, 122 is a transistor.

The power switch 90 has first and second terminals. The first terminal of the power switch 90 is electrically coupled to the positive terminal 60 of the battery 30. The second terminal of the power switch 90 is electrically coupled to the electrical node 172 and to the electrical switches 100, 104, 108, 112, 116, 120 of first, second, third, fourth, fifth, sixth switching banks, respectively. The power switch 90 transitions from an open operational state to a closed operational state in response to a control signal C13 from the microcontroller 38. Further, the power switch 90 transitions from the closed operational state to the open operational state when the microcontroller 38 stops generating the control signal C13.

The capacitor 92 is electrically coupled between the electrical node 170 and the electrical node 178 (which is coupled to electrical ground). Further, the capacitor 92 is electrically coupled between the positive terminal 60 and the negative terminal 62 of the battery 30. The capacitor 94 is electrically coupled between the electrical node 172 and the electrical node 178 (which is coupled to electrical ground).

The switches 100, 102 comprise a first switching bank. The switches 100, 102 are selectively electrically coupled in series to the resistor 130. Further, an electrical node 174 is disposed between the switches 100, 102. The electrical coil 140 is electrically coupled to and between the electrical node 174 and an electrical node 190. A capacitor 162 is electrically coupled between the electrical node 190 and the electrical node 178 (which is coupled to electrical ground). During operation, when the microcontroller 38 generates control signals C1, C2 which are received by the switches 100, 102, respectively, the switches 100, 102 each transition to a closed operational state which energizes the electrical coil 140, and allows an electrical current to flow through the resistor 130.

The switches 104, 106 comprise a second switching bank. The switches 104, 106 are selectively electrically coupled in series to the resistor 130. Further, an electrical node 180 is disposed between the switches 104, 106. The electrical coil 142 is electrically coupled to and between the electrical node 180 and the electrical node 190. During operation, when the microcontroller 38 generates control signals C3, C4 which are received by the switches 104, 106, respectively, the switches 104, 106 each transition to a closed operational state which energizes the electrical coil 142, and allows an electrical current to flow through the resistor 130.

The switches 108, 110 comprise a third switching bank. The switches 108, 110 are selectively electrically coupled in series to the resistor 130. Further, an electrical node 182 is disposed between the switches 108, 110. The electrical coil 144 is electrically coupled to and between the electrical node 182 and the electrical node 190. During operation, when the microcontroller 38 generates control signals C5, C6 which are received by the switches 108, 110, respectively, the switches 108, 110 each transition to a closed operational state which energizes the electrical coil 144, and allows an electrical current to flow through the resistor 130.

The switches 112, 114 comprise a fourth switching bank. The switches 112, 114 are selectively electrically coupled in series to the resistor 132. Further, an electrical node 184 is disposed between the switches 112, 114. The electrical coil 146 is electrically coupled to and between the electrical node 184 and the electrical node 190. During operation, when the microcontroller 38 generates control signals C7, C8 which are received by the switches 112, 114, respectively, the switches 112, 114 each transition to a closed operational state which energizes the electrical coil 146, and allows an electrical current to flow through the resistor 132.

The switches 116, 118 comprise a fifth switching bank. The switches 116, 118 are selectively electrically coupled in series to the resistor 132. Further, an electrical node 186 is disposed between the switches 116, 118. The electrical coil 148 is electrically coupled to and between the electrical node 186 and the electrical node 190. During operation, when the microcontroller 38 generates control signals C9, C10 which are received by the switches 116, 118, respectively, the switches 116, 118 each transition to a closed operational state which energizes the electrical coil 148, and allows an electrical current to flow through the resistor 132.

The switches 120, 122 comprise a sixth switching bank. The switches 120, 122 are selectively electrically coupled in series to the resistor 132. Further, an electrical node 188 is disposed between the switches 120, 122. The electrical coil 150 is electrically coupled to and between the electrical node 188 and the electrical node 190. During operation, when the microcontroller 38 generates control signals C11, C12 which are received by the switches 120, 122, respectively, the switches 120, 122 each transition to a closed operational state which energizes the electrical coil 150, and allows electrical current to flow through the resistor 132.

During operation, the first, second, third, fourth, fifth, and sixth switching banks of the DC-DC voltage converter 32 are sequentially activated by the microcontroller 38.

The power switch 160 has first and second terminals. The first terminal of the power switch 160 is electrically coupled to the electrical node 190, and to the electrical coils 140, 142, 144, 146, 148, 150. The second terminal of the power switch 160 is electrically coupled to the electrical node 192, and to the capacitor 164, and to the positive terminal 210 of the battery 34. The capacitor 162 is electrically coupled to and between the electrical node 190 and the electrical node 178 (which is coupled to electrical ground). The power switch 160 transitions from an open operational state to a closed operational state in response to a control signal C14 from the microcontroller 38. Further, the power switch 160 transitions from the closed operational state to the open operational state when the microcontroller 38 stops generating a control signal C14.

The battery 34 provides a second operational voltage to the DC-DC voltage converter 32. The battery 34 includes a positive terminal 210 and a negative terminal 212. The positive terminal 210 is electrically coupled to the electrical node 192 and to the second terminal of the power switch 160. The negative terminal 212 is electrically coupled to the electrical node 178 and to the negative terminal 62 of the battery 30. In an exemplary embodiment, the battery 34 is a low-voltage lead-acid battery (e.g., 12 volt battery).

Figure 2:
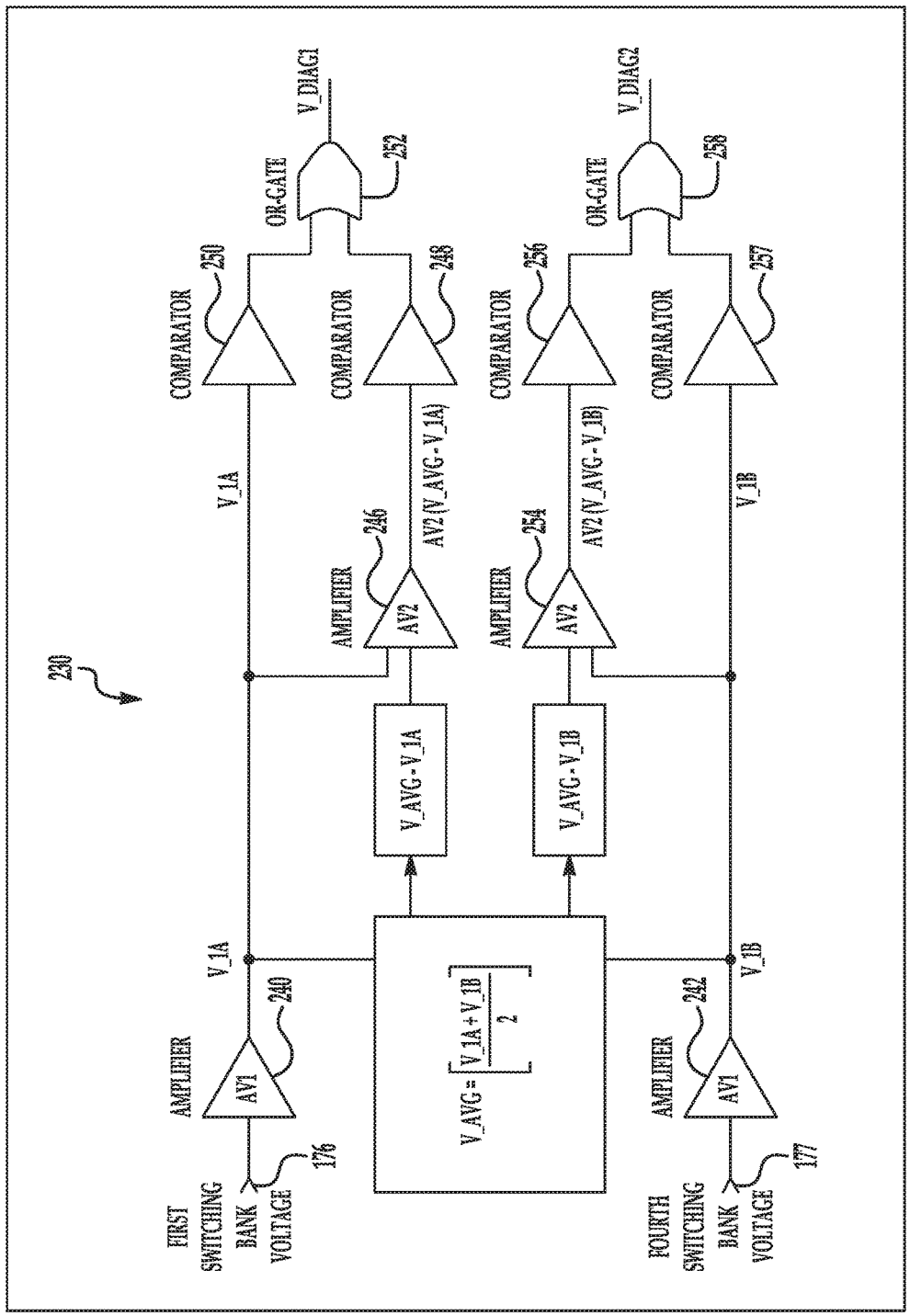
FIG. 2 is a block diagram of a detection system for a DC-DC voltage converter utilized in the power supply system of FIG. 1.
Figure 3:
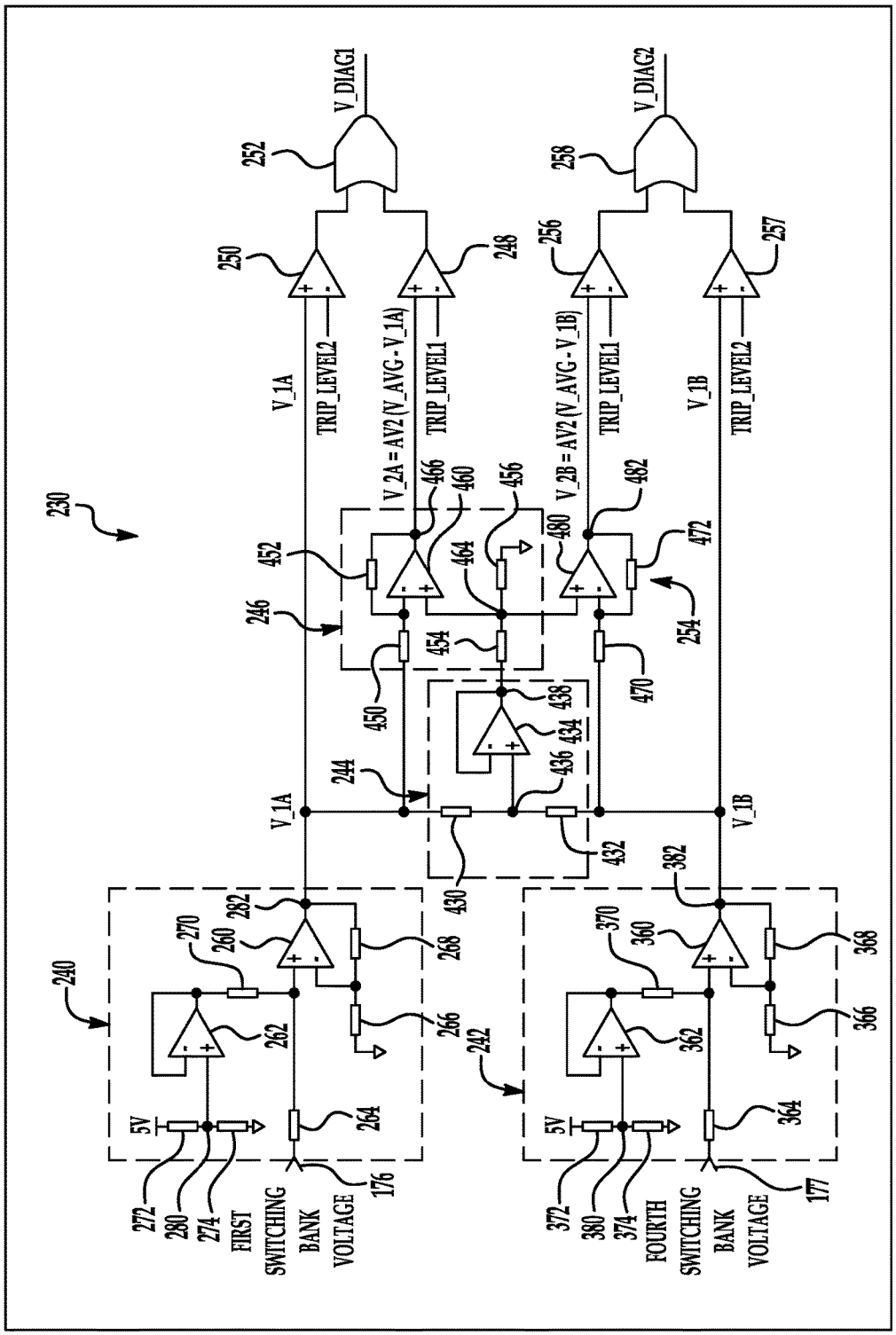
FIG. 3 is a circuit schematic of the detection system of FIG. 2.

Referring to FIGS. 1-3, a detection system 36 for determining an unbalanced current condition and an over-current condition in the DC-DC voltage converter 32, in accordance with an exemplary embodiment will now be described. For purposes of simplicity, the detection system 36 will be described hereinafter as determining an unbalanced current condition between the first switching bank (e.g., switches 100, 102) coupled to the resistor 130, and the fourth switching bank (e.g., switches 112, 114) coupled to the resistor 132, and over-current conditions in the first switching bank and the fourth switching bank. Of course, it is noted that the detection circuit 230 could determine an unbalanced current condition between any one of the first, second, third switching banks relative to the fourth, fifth, and sixth switching banks, and an over-current condition in the first, second, third, fourth, fifth, and sixth switching banks.

The detection system 36 includes a detection circuit 230 having amplifiers 240, 242, an averaging circuit 244, an amplifier 246, comparators 248, 250, an OR logic gate 252, an amplifier 254, comparators 256, 257, and an OR logic gate 258. An advantage of the detection circuit 230 is that the circuit 230 can determine an unbalanced current condition in the first and fourth switching banks of the DC-DC voltage converter 32 utilizing an average voltage value—even if an over-current condition in one of first and fourth switching banks in the DC-DC voltage converter 32 is not detectable.

The amplifier 240 is electrically coupled to the electrical node 176 of the DC-DC voltage converter 32 and is provided to output a first amplified voltage (V_1A) in response to receiving a first voltage across the resistor 130 (shown in FIG. 1). The first voltage across the resistor 130 indicates a sensing current (I_SA) flowing through the resistor 130. The amplifier 240 includes operational amplifiers 260, 262, resistors 264, 266, 268, 270, 272, 274, and electrical nodes 280, 282.

The operational amplifier 260 includes a non-inverting terminal, an inverting terminal, and an output terminal. The resistor 264 is electrically coupled to and between the electrical node 176 and the non-inverting terminal of the operational amplifier 264 and receives the first voltage across the resistor 130. The first voltage across the resistor 130 is indicative of an amount of current (e.g., an amount of a sensing current I_SA) flowing through the first switching bank when the switches 100, 102 each have a closed operational state. The resistor 266 is electrically coupled between electrical ground and the inverting terminal of the operational amplifier 260. The resistor 268 is electrically coupled between the inverting terminal of the operational amplifier 260 and an output terminal of the operational amplifier 260.

The operational amplifier 262 includes a non-inverting terminal, an inverting terminal, and an output terminal. The resistor 272 is electrically coupled between a voltage supply (e.g. 5 volt DC reference voltage) and the electrical node 280. The resistor 274 is electrically coupled between the electrical node 280 and electrical ground. The electrical node 280 is electrically coupled to the non-inverting terminal of the operational amplifier 262. The inverting terminal of the operational amplifier 262 is electrically coupled to the output terminal of the operational amplifier 262. The resistor 270 is electrically coupled between the output terminal of the operational amplifier 262 and the non-inverting terminal of the operational amplifier 260.

The output terminal of the operational amplifier 260 is electrically coupled to an electrical node 282. The amplifier 240 outputs the first amplified voltage (V_1A) at the output terminal of the operational amplifier 260 in response to receiving the first voltage across the resistor 130.

The amplifier 242 is electrically coupled to the electrical node 177 of the DC-DC voltage converter 32 and is provided to output a second amplified voltage (V_1B) in response to receiving a second voltage across the resistor 132 (shown in FIG. 1). The second voltage across the resistor 132 indicates a sensing current (I_SB) flowing through the resistor 132. The amplifier 242 includes operational amplifiers 360, 362, resistors 364, 366, 368, 370, 372, 374, and electrical nodes 380, 382.

The operational amplifier 360 includes a non-inverting terminal, an inverting terminal, and an output terminal. The resistor 364 is electrically coupled to and between the electrical node 177 and the non-inverting terminal of the operational amplifier 364 and receives the second voltage across the resistor 132. The second voltage across the resistor 132 is indicative of an amount of current (e.g., an amount of a sensing current I_SB) flowing through the fourth switching bank when the switches 112, 114 each have a closed operational state. The resistor 366 is electrically coupled between electrical ground and the inverting terminal of the operational amplifier 360. The resistor 368 is electrically coupled between the inverting terminal of the operational amplifier 360 and an output terminal of the operational amplifier 360.

The operational amplifier 362 includes a non-inverting terminal, an inverting terminal, and an output terminal. The resistor 372 is electrically coupled between a voltage supply (e.g. 5 volt DC reference voltage) and the electrical node 380. The resistor 374 is electrically coupled between the electrical node 380 and electrical ground. The electrical node 380 is electrically coupled to the non-inverting terminal of the operational amplifier 362. The non-inverting terminal of the operational amplifier 362 is electrically coupled to the output terminal of the operational amplifier 362. The resistor 370 is electrically coupled between the output terminal of the operational amplifier 362 and the non-inverting terminal of the operational amplifier 360.

The output terminal of the operational amplifier 360 is electrically coupled to an electrical node 382. The amplifier 242 outputs the second amplified voltage (V_1B) at the output terminal of the operational amplifier 360 in response to receiving the second voltage across the resistor 132.

Referring to FIGS. 2 and 3, the averaging circuit 244 is electrically coupled to the amplifiers 240, 242 and outputs an average voltage (V_AVG) in response to receiving the first and second amplified voltages (V_1A), (V_1B) from the amplifiers 240, 242, respectively. The averaging circuit 244 includes resistors 430, 432, a buffer 434, and electrical nodes 436, 438. The buffer 434 includes a non-inverting terminal, an inverting terminal, and an output terminal. The resistor 430 is electrically coupled to and between the electrical node 282 (which is electrically coupled to the output of the operational amplifier 260) and electrical node 436 (which is electrically coupled to a non-inverting terminal of the buffer 434). The resistor 432 is electrically to and between the electrical node 436 and the electrical node 382 (which is electrically coupled to the output of the operational amplifier 360). The resistors 430, 432 are electrically coupled in series and are a voltage divider circuit. The inverting terminal of the buffer 434 is electrically coupled to the output terminal of the buffer 434 and to the electrical node 438. The buffer 434 outputs the average voltage (V_AVG) at the output terminal thereof.

The amplifier 246 is electrically coupled to the electrical nodes 282 and 438 and is provided to output a third amplified voltage (V_2A) in response to receiving the average voltage (V_AVG) from the averaging circuit 244 and the first amplified voltage (V_1A) from the amplifier 240. The third amplified voltage (V_2A) is proportional to a difference between the average voltage (V_AVG) and the first amplified voltage (V_1A). The amplifier 246 includes resistors 450, 452, 454, 456, an operational amplifier 460, and electrical nodes 462, 466.

The resistor 450 is electrically coupled to and between the electrical node 282 and an inverting terminal of the operational amplifier 460. The resistor 452 is electrically coupled between the inverting terminal of the operational amplifier 460 and an output terminal of the operational amplifier 460 (which is electrically coupled to an electrical node 466). The resistor 454 is electrically coupled to and between the electrical node 438 and the electrical node 464 (which is further electrically coupled to the non-inverting terminal of the operational amplifier 460). The resistor 464 is electrically coupled to and between electrical node 464 and electrical ground.

The operational amplifier 460 outputs the third amplified voltage (V2A) corresponding to the following equation: V_2A=AV2(V_AVG−V_1A), wherein AV2 is the gain of the operational amplifier 460. The third amplified voltage (V_2A) is received at a first input terminal of the comparator 248.

The comparator 248 has first and second input terminals and an output terminal. The first input terminal of the comparator 248 is electrically coupled to the output terminal of the operational amplifier 460 of the amplifier 246 and receives the third amplified voltage (V_2A) from the amplifier 246. The second input terminal of the comparator 248 is electrically coupled to the microcontroller 38 and receives a first reference voltage (TRI_P LEVEL1) from the microcontroller 38. The comparator 248 outputs a first monitoring voltage on the output terminal thereof based on a comparison of the third amplified voltage (V_2A) from the amplifier 246 and the first reference voltage (TRIP_LEVEL1). In particular, the comparator 248 outputs a first monitoring voltage having first logic voltage level (e.g., a high logic voltage level corresponding to a binary "1") if the third amplified voltage (V_2A) is greater than or equal to the first reference voltage (TRIP_LEVEL1) indicating the unbalanced current condition between the first and fourth switching banks in the DC-DC voltage converter 32. Also, the comparator 248 outputs the first monitoring voltage having a second logic voltage level (e.g., a low logic voltage level corresponding to a binary "0") if the third amplified voltage (V_2A) is less than the first reference voltage (TRIP_LEVEL1) indicating a balanced current condition between the first and fourth switching banks in the DC-DC voltage converter 32.

The comparator 250 has first and second input terminals and an output terminal. The first input terminal of the comparator 250 is electrically coupled to the output terminal of the operational amplifier 260 of the amplifier 240 and receives the first amplified voltage (V_1A) from the amplifier 240. The second input terminal of the comparator 250 is electrically coupled to the microcontroller 38 and receives a second reference voltage (TRIP_LEVEL2) from the microcontroller 38. The comparator 250 outputs a second monitoring voltage on the output terminal thereof based on a comparison of the first amplified voltage (V_1A) from the amplifier 240 and the second reference voltage (TRIP_LEVEL2). In particular, the comparator 250 outputs the second monitoring voltage having a first logic voltage level (e.g., a high logic voltage level corresponding to a binary "1") if the first amplified voltage (V_1A) is greater than or equal to the second reference voltage (TRIP_LEVEL2) indicating an over-current condition in the first switching bank of the DC-DC voltage converter 32. Also, the comparator 250 outputs the second monitoring voltage having a second logic voltage level (e.g., a low logic voltage level corresponding to a binary "0") if the first amplified voltage (V_1A) is less than the second reference voltage (TRIP_LEVEL2) indicating an acceptable current condition in the first switching bank of the DC-DC voltage converter 32.

The OR logic gate 252 has first and second input terminals and an output terminal. The first input terminal of the OR logic gate 252 is electrically coupled to the output terminal of the comparator 248 and receives the first monitoring voltage from the comparator 248. The second input terminal of the OR logic gate 252 is electrically coupled to the output terminal of the comparator 250 and receives the second monitoring voltage from the comparator 250. The output terminal of the OR logic gate 252 is electrically coupled to the microcontroller 38. The OR logic gate 252 outputs a first diagnostic voltage (V_DIAG1) having the first logic voltage level (e.g., high logic voltage level corresponding to a binary "1") indicating either the unbalanced current condition between the first and fourth switching banks in the DC-DC voltage converter 32 or the over-current condition in the first switching bank if the first monitoring voltage has the first logic voltage level or the second monitoring voltage has the first logic voltage level. Also, the OR logic gate 252 outputs the first diagnostic voltage (V_DIAG1) having a second logic voltage level (e.g., low logic voltage level corresponding to a binary "0") indicating a balanced current condition between the first and fourth switching banks in the DC-DC voltage converter 32 and an acceptable current condition in the first switching bank if the first monitoring voltage has the second logic voltage level and the second monitoring voltage has the second logic voltage level.

The amplifier 254 is electrically coupled to the electrical nodes 382 and 438 and is provided to output a fourth amplified voltage (V_2B) in response to receiving the average voltage (V_AVG) from the averaging circuit 244 and the second amplified voltage (V_1B) from the amplifier 242. The fourth amplified voltage (V_2B) is proportional to a difference between the average voltage (V_AVG) and the second amplified voltage (V_1B). The amplifier 254 includes resistors 454, 456, 470, 472 an operational amplifier 480, and an electrical node 482.

The resistor 454 is electrically coupled to and between the electrical node 438 and electrical node 464 (which is further electrically coupled to the non-inverting terminal of the operational amplifier 480). The resistor 464 is electrically coupled to and between the electrical node 464 and electrical ground.

The operational amplifier 480 outputs the fourth amplified voltage (V2B) corresponding to the following equation: V_2B=AV2(V_AVG−V_1B), wherein AV2 is the gain of the operational amplifier 480. The fourth amplified voltage (V_2B) is received at a first input terminal of the comparator 256.

The comparator 256 has first and second input terminals and an output terminal. The first input terminal of the comparator 256 is electrically coupled to the output terminal of the operational amplifier 480 of the amplifier 254 and receives fourth amplified voltage (V_2B) from the amplifier 254. The second input terminal of the comparator 256 is electrically coupled to the microcontroller 38 and receives the first reference voltage (TRIP_LEVEL1) from the microcontroller 38. The comparator 256 outputs a third monitoring voltage on the output terminal thereof based on a comparison of the fourth amplified voltage (V_2B) from the amplifier 254 and the first reference voltage (TRIP_LEVEL1). In particular, the comparator 256 outputs a third monitoring voltage having first logic voltage level (e.g., a high logic voltage level corresponding to a binary "1") if the fourth amplified voltage (V_2B) is greater than or equal to the first reference voltage (TRIP_LEVEL1) indicating the unbalanced current condition between the first and fourth switching banks in the DC-DC voltage converter 32. Also, the comparator 256 outputs the third monitoring voltage having a second logic voltage level (e.g., a low logic voltage level corresponding to a binary "0") if the fourth amplified voltage (V_2B) is less than the first reference voltage (TRIP_LEVEL1) indicating a balanced current condition between the first and fourth switching banks in the DC-DC voltage converter 32.

The comparator 257 has first and second input terminals and an output terminal. The first input terminal of the comparator 257 is electrically coupled to the output terminal of the operational amplifier 360 of the amplifier 242 and receives the second amplified voltage (V_1B) from the amplifier 242. The second input terminal of the comparator 257 is electrically coupled to the microcontroller 38 and receives the second reference voltage (TRIP_LEVEL2) from the microcontroller 38. The comparator 257 outputs a fourth monitoring voltage on the output terminal thereof based on a comparison of the second amplified voltage (V_1B) from the amplifier 242 and the second reference voltage (TRIP_LEVEL2). In particular, the comparator 250 outputs the fourth monitoring voltage having a first logic voltage level (e.g., a high logic voltage level corresponding to a binary "1") if the second amplified voltage (V_1B) is greater than or equal to the second reference voltage (TRIP_LEVEL2) indicating an over-current condition in the fourth switching bank of the DC-DC voltage converter 32. Also, the comparator 257 outputs the fourth monitoring voltage having a second logic voltage level (e.g., a low logic voltage level corresponding to a binary "0") if the second amplified voltage (V_1B) is less than the second reference voltage (TRIP_LEVEL2) indicating an acceptable current condition in the fourth switching bank of the DC-DC voltage converter 32.

The OR logic gate 258 has first and second input terminals and an output terminal. The first input terminal of the OR logic gate 258 is electrically coupled to the output terminal of the comparator 256 and receives the third monitoring voltage from the comparator 256. The second input terminal of the OR logic gate 258 is electrically coupled to the output terminal of the comparator 257 and receives the fourth monitoring voltage from the comparator 257. The output terminal of the OR logic gate 258 is electrically coupled to the microcontroller 38. The OR logic gate 258 outputs a second diagnostic voltage (V_DIAG2) having the first logic voltage level (e.g., high logic voltage level corresponding to a binary "1") indicating either the unbalanced current condition between the first and fourth switching banks in the DC-DC voltage converter 32 or the over-current condition in the fourth switching bank if the third monitoring voltage has the first logic voltage level or the fourth monitoring voltage has the first logic voltage level. Also, the OR logic gate 252 outputs the second diagnostic voltage (V_DIAG2) having a second logic voltage level (e.g., low logic voltage level corresponding to a binary "0") indicating a balanced current condition between the first and fourth switching banks in the DC-DC voltage converter 32 and an acceptable current condition in the fourth switching bank if the third monitoring voltage has the second logic voltage level and the fourth monitoring voltage has the second logic voltage level.

Referring to FIGS. 1-3, the microcontroller 38 is operably coupled to the switches 100, 102, 104, 106, 108, 110, 112, 114, 116, 118, 120, 122, power switches 90, 160, and the OR logic gates 252, 254. The microcontroller 38 includes a microprocessor 500 and a memory device 502 which is operably coupled to the microprocessor 500. The microprocessor 500 is programmed to execute software instructions stored in the memory device 502 for implementing the associated steps described herein. Further, the memory device 502 stores computed values and predetermined values therein.

The microcontroller 38 sequentially generates the control signals for the first, second, third, fourth, fifth, and sixth switching banks in the DC-DC voltage converter 32. Further, the microcontroller 38 generates a first control signal to transition the power switch 90 to an open operational state in response to the first diagnostic voltage (V_DIAG1) having the first logic voltage level. Further, the microcontroller 38 generates a second control signal to transition the power switch 160 to the open operational state in response to the second diagnostic voltage (V_DIAG2) having the first logic voltage level.

Figure 4:
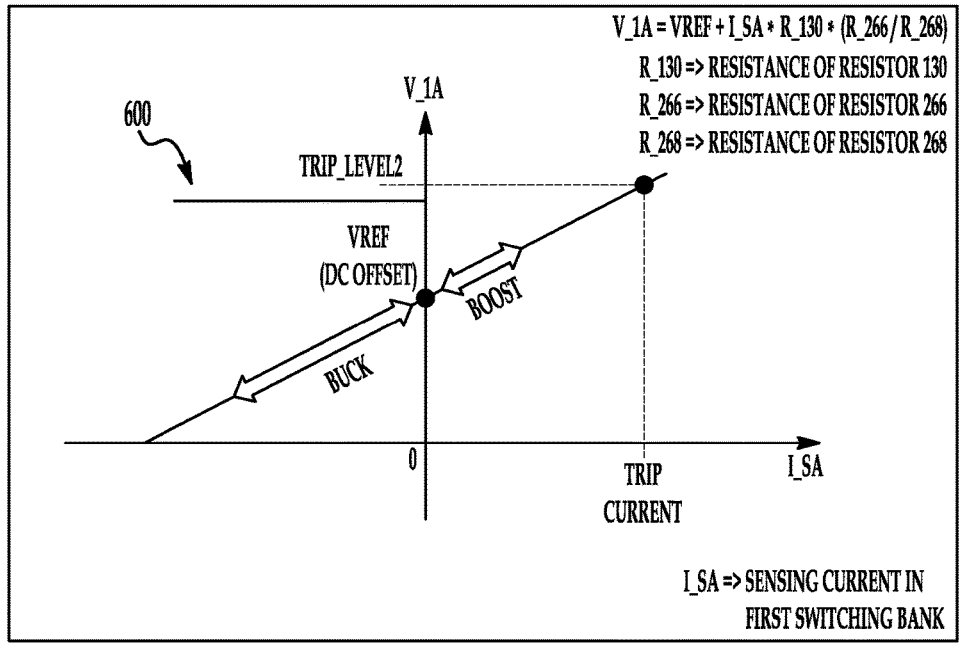
FIG. 4 is a graph of a first amplified voltage relative to a trip voltage for indicating an over-current condition of a first switching bank in the DC-DC voltage converter.

Referring to FIG. 4, a graph 600 illustrates a first amplified voltage (V_1A) relative to a trip current for determining an over-current condition of a first switching bank of the DC-DC voltage converter 32 is illustrated. As shown, during boost mode operation, when the first amplified voltage (V_1A) is greater the TRIP_LEVEL2 voltage, the current I_SA flowing through the first switching bank and the resistor 130 has an over-current condition.

Figure 5:
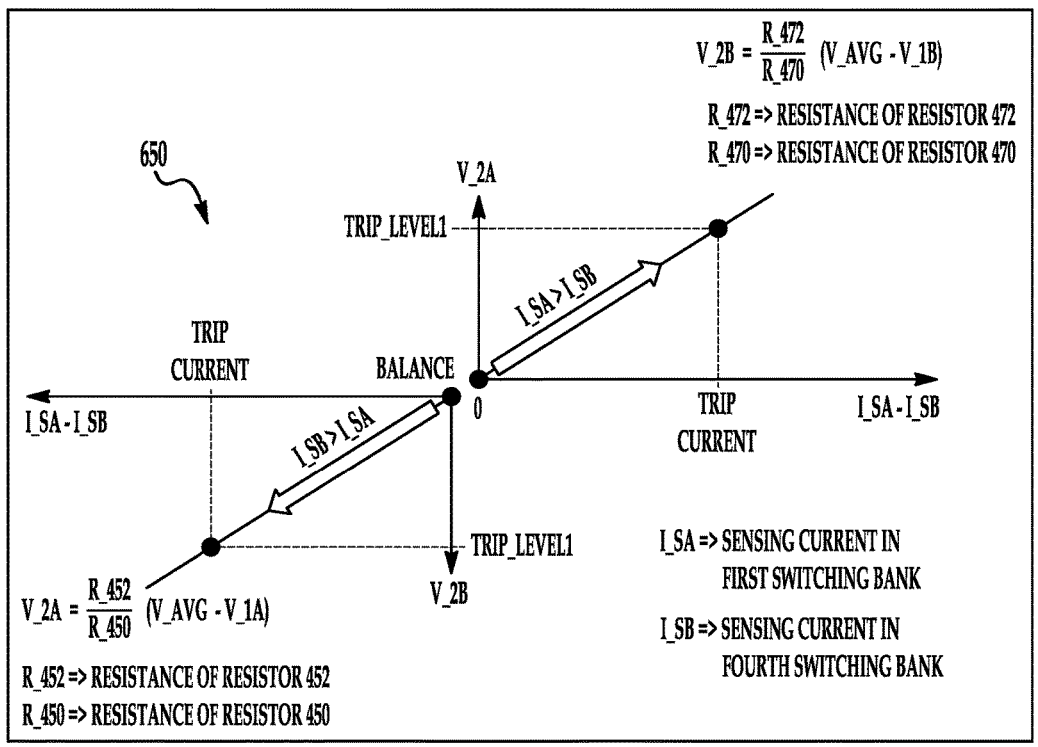
FIG. 5 is a graph of third and fourth amplified voltages relative to a trip voltage for indicating an unbalanced current condition in first and second switching banks of the DC-DC voltage converter.

Referring to FIG. 5, a graph 650 illustrates third and fourth amplified voltages (V_2A) (V_2B) relative to a trip current for determining an unbalanced current condition in the first and fourth switching banks of the DC-DC voltage converter 32 is illustrated. As shown, when the third amplified voltage (V_2A) is greater the TRIP_LEVEL1 voltage, the current (I_SA) flowing through the first switching bank and the resistor 130 is greater than the current (I_SB) flowing through the fourth switching bank and the resistor 132—indicating an unbalanced current condition between the first and fourth switching banks. Further, when the fourth amplified voltage (V_2B) is greater the TRIP_LEVEL1 voltage, the current (I_SB) flowing through the fourth switching bank and the resistor 132 is greater than the current (I_SA) flowing through the first switching bank and the resistor 130—indicating an unbalanced current condition between the first and fourth switching banks.

The power supply system described herein provides a substantial advantage over other system. In particular, the power supply system utilizes a detection system that can determine an unbalanced current condition in first and second switching banks within the DC-DC voltage converter utilizing an average voltage value—even if an over-current condition in one of first and second switching banks in the DC-DC voltage converter is not detectable.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A detection system for determining an unbalanced current condition and an over-current condition in a DC-DC voltage converter, the DC-DC voltage converter having first and second switching banks, comprising:
    a detection circuit receiving a first voltage across a first resistor that is electrically coupled to the first switching bank;
    the detection circuit receiving a second voltage across a second resistor that is electrically coupled to the second switching bank;
    the detection circuit determining an average voltage based on the first and second voltages;
    the detection circuit outputting a first diagnostic voltage indicating either an unbalanced current condition between the first and second switching banks in the DC-DC voltage converter based on the first voltage and the average voltage, or an over-current condition in the first switching bank based on the first voltage;
    the detection circuit outputting a second diagnostic voltage indicating either the unbalanced current condition between the first and second switching banks in the DC-DC voltage converter based on the second voltage and the average voltage, or an over-current condition in the second switching bank based on the second voltage,
    wherein the first switching bank having first and second switches being selectively electrically coupled in series with the first resistor, the second switching bank having third and fourth switches being selectively electrically coupled in series to the second resistor, and the detection circuit includes first, second, third amplifiers, an averaging circuit, and first and second comparators;
    the first amplifier outputting a first amplified voltage in response to receiving the first voltage across the first resistor;
    the second amplifier outputting a second amplified voltage in response to receiving the second voltage across the second resistor;
    the averaging circuit outputting an average voltage in response to receiving the first and second amplified voltages from the first and second amplifiers, respectively;
    the third amplifier outputting a third amplified voltage in response to receiving the average voltage from the averaging circuit and the first amplified voltage from the first amplifier, the third amplified voltage being proportional to a difference between the average voltage and the first amplified voltage;
    the first comparator outputting a first monitoring voltage in response to receiving the third amplified voltage from the third amplifier and a first reference voltage, the first monitoring voltage having the first logic voltage level if the third amplified voltage is greater than or equal to the first reference voltage indicating the unbalanced current condition between the first and second switching banks in the DC-DC volt-age converter; and
    the second comparator outputting a second monitoring voltage in response to receiving the first amplified voltage from the first amplifier and a second reference voltage, the second reference voltage having the first logic voltage level it the first amplified voltage is greater than or equal to the second reference voltage indicating the over-current condition in the first switching bank.

2. The detection system of claim 1, wherein
    the detection circuit further includes a first OR logic gate;
    the first OR logic gate outputting the first diagnostic voltage based on the first and second monitoring voltages, the first diagnostic voltage having the first logic voltage level indicating either the unbalanced current condition between the first and second switching banks in the DC-DC voltage converter or the over-current condition in the first switching bank if the first monitoring voltage has the first logic voltage level or the second monitoring voltage has the first logic voltage level.

3. The detection system of claim 2, further comprising a fourth amplifier, and third and fourth comparators, and a second OR logic gate;
    the fourth amplifier outputting a fourth amplified voltage in response to receiving the average voltage from the averaging circuit and the second amplified voltage from the second amplifier, the fourth amplified voltage being proportional to a difference between the average voltage and the second amplified voltage;
    the third comparator outputting a third monitoring voltage in response to receiving the fourth amplified voltage from the fourth amplifier and the first reference voltage, the third monitoring voltage having the first logic voltage level if the fourth amplified voltage is greater than or equal to the first reference voltage indicating the unbalanced current condition between the first and second switching banks in the DC-DC voltage converter,
    the fourth comparator outputting a fourth monitoring voltage in response to receiving the second amplified voltage from the second amplifier and the second reference voltage, the fourth monitoring voltage having the first logic voltage level if the second amplified voltage is greater than or equal to the second reference voltage indicating the over-current condition in the second switching bank; and
    the second OR logic gate outputting the second diagnostic voltage based on the third and fourth monitoring voltages, the second diagnostic voltage having the first logic voltage level indicating either the unbalanced current condition between the first and second switching banks in the DC-DC voltage converter or the over-current condition in the second switching bank if the third monitoring voltage has the first logic voltage level or the fourth monitoring voltage has the first logic voltage level.

4. The detection system of claim 3, wherein the fourth amplified voltage corresponds to the difference between the average voltage and the second amplified voltage.

5. The detection system of claim 1, wherein the third amplified voltage corresponds to the difference between the average voltage and the first amplified voltage multiplied by a first voltage gain of the third amplifier.

6. The detection system of claim 1, wherein the first amplifier receives the first voltage when the first and second switches of the first switching bank each have the closed operational state at a first time.

7. The detection system of claim 6, wherein the second amplifier receives the second voltage when the first and second switches of the first switching bank each have a closed operational state at the first time.

8. The detection system of claim 1, wherein:
the averaging circuit includes third and fourth resistors and a buffer; the buffer having a non-inverting terminal, an inverting terminal, and an output terminal; the third resistor being electrically coupled to and between the first amplifier and the non-inverting terminal, the fourth resistor being electrically coupled to and between the second amplifier and the non-inverting terminal, the inverting terminal being electrically coupled to the output terminal, the output terminal outputting an average voltage in response to the first and second amplified voltages being received at the third and fourth resistors, respectively.

9. A power supply system, comprising:
a DC-DC voltage converter having first and second switching banks, first and second resistors, first and second electrical coils, first and second power switches, and first and second batteries;
the first switching bank being selectively electrically coupled in series to the first resistor,
the second switching bank being selectively electrically coupled in series to the second resistor;
the first electrical coil being electrically coupled to the first switching bank and the second power switch;
the second electrical coil being electrically coupled to the second switching bank and the second power switch;
the first power switch being electrically coupled to the first battery and to the first and second switching banks;
the second power switch being electrically coupled to the first and second electrical coils and the second battery;
a detection circuit receiving a first voltage across the first resistor;
the detection circuit receiving a second voltage across the second resistor,
the detection circuit determining an average voltage based on the first and second voltages;
the detection circuit outputting a first diagnostic voltage indicating either an unbalanced current condition between the first and second switching banks in the DC-DC voltage converter based on the first voltage and the average voltage, or an over-current condition in the first switching bank based on the first voltage; and
the detection circuit outputting a second diagnostic voltage indicating either the unbalanced current condition between the first and second switching banks in the DC-DC voltage converter based on the second voltage and the average voltage, or an over-current condition in the second switching bank based on the second voltage,
wherein the detection circuit further includes first, second, third amplifiers, an averaging circuit, and first and second comparators;
the first amplifier outputting a first amplified voltage in response to receiving the first voltage across the first resistor;
the second amplifier outputting a second amplified voltage in response to receiving the second voltage across the second resistor;
the averaging circuit outputting an average voltage in response to receiving the first and second amplified voltages from the first and second amplifiers, respectively;
the third amplifier outputting a third amplified voltage in response to receiving the average voltage from the averaging circuit and the first amplified voltage from the first amplifier, the third amplified voltage being proportional to a difference between the average voltage and the first amplified voltage;
the first comparator outputting a first monitoring voltage in response to receiving the third amplified voltage from the third amplifier and a first reference voltage, the first monitoring voltage having the first logic voltage level if the third amplified voltage is greater than or equal to the first reference voltage indicating the unbalanced current condition between the first and second switching banks in the DC-DC voltage converter; and
the second comparator outputting a second monitoring voltage in response to receiving the first amplified voltage from the first amplifier and a second reference voltage, the second monitoring voltage having the first logic voltage level if the first amplified voltage is greater than or equal to the second reference voltage indicating the over-current condition in the first switching bank.

10. The power supply system of claim 9, wherein
the detection circuit further includes a first OR logic gate;
the first OR logic gate outputting the first diagnostic voltage based on the first and second monitoring voltages, the first diagnostic voltage having the first logic voltage level indicating either the unbalanced current condition between the first and second switching banks in the DC-DC voltage converter or the over-current condition in the first switching bank if the first monitoring voltage has the first logic voltage level or the second monitoring voltage has the first logic voltage level.

11. The power supply system of claim 10, further comprising a fourth amplifier, and third and fourth comparators, t and second OR logic gate;
the fourth amplifier outputting a fourth amplified voltage in response to receiving the average voltage from the averaging circuit and the second amplified voltage from the second amplifier, the fourth amplified voltage being proportional to a difference between the average voltage and the second amplified voltage;
the third comparator outputting a third monitoring voltage in response to receiving the fourth amplified voltage from the difference between the fourth amplifier and the first reference voltage, the third monitoring voltage having the first logic voltage level if the fourth amplified voltage is greater than or equal to the first reference voltage indicating the unbalanced current condition between the first and second switching banks in the DC-DC voltage converter,
the fourth comparator outputting a fourth monitoring voltage in response to receiving the second amplified voltage from the second amplifier and the second reference voltage, the fourth monitoring voltage having the first logic voltage level if the second amplified voltage is greater than or equal to the second reference voltage indicating the over-current condition in the second switching bank; and the second OR logic gate outputting the second diagnostic voltage based on the third and fourth monitoring voltages, the second diagnostic voltage having the first logic voltage level indicating either the unbalanced current condition between the first and second switching banks in the DC-DC voltage converter or the over-current condition in the second switching bank if the third monitoring voltage has the first logic voltage level or the fourth monitoring voltage has the first logic voltage level.

12. The power supply system of claim 11, wherein the fourth amplified voltage corresponds to the difference between the average voltage and the second amplified voltage.

13. The power supply system of claim 9, wherein the third amplified voltage corresponds to the difference between the average voltage and the first amplified voltage multiplied by a first voltage gain of the third amplifier.

14. The power supply system of claim 13, further comprising a microcontroller, the microcontroller generating a first control signal to transition the first power switch to an open operational state in response to the first diagnostic voltage having the first logic voltage level; and the microcontroller generating a second control signal to transition the second power switch to the open operational state in response to the second diagnostic voltage having the first logic voltage level.

15. The power supply system of claim 9, wherein the first amplifier receives the first voltage when the first and second switches of the first switching bank each have the closed operational state at a first time.

16. The power supply system of claim 15, wherein the second amplifier receives the second voltage when the first and second switches of the first switching bank each have a closed operational state at the first time.

17. The power supply system of claim 9, wherein:

the first switching bank having first and second switches being selectively electrically coupled in series to the first resistor;

the second switching bank having third and fourth switches being selectively electrically coupled in series to the second resistor, the first electrical coil having first and second ends, the first end of the first electrical coil being electrically coupled to a first electrical node disposed between the first and second switches, the second end of the first electrical coil being electrically coupled to a second electrical node;

the second electrical coil having first and second ends, the first end of the second electrical coil being electrically coupled to a third electrical node disposed between the third and fourth switches, the second end of the second electrical coil being electrically coupled to the second electrical node;

the first power switch having first and second terminals, the first terminal of the first power switch being electrically coupled to the first battery, the second terminal of the first power switch being electrically coupled to both the first switch of the first switching bank and to the third switch of the second switching bank; and the second power switch having first and second terminals, the first terminal of the second power switch being electrically coupled to the second electrical node, the second terminal of the second power switch being electrically coupled to the second battery.

18. The power supply system of claim 9, wherein:

the averaging circuit includes third and fourth resistors and a buffer; the buffer having a non-inverting terminal, an inverting terminal, and an output terminal; the third resistor being electrically coupled to and between the first amplifier and the non-inverting terminal, the fourth resistor being electrically coupled to and between the second amplifier and the non-inverting terminal, the inverting terminal being electrically coupled to the output terminal, the output terminal outputting an average voltage in response to the first and second amplified voltages being received at the third and fourth resistors, respectively.

* * * * *